United States Patent
Pendharkar et al.

(10) Patent No.: US 8,264,038 B2
(45) Date of Patent: Sep. 11, 2012

(54) BURIED FLOATING LAYER STRUCTURE FOR IMPROVED BREAKDOWN

(75) Inventors: Sameer P. Pendharkar, Allen, TX (US); Binghua Hu, Plano, TX (US); Xinfen Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 328 days.

(21) Appl. No.: 12/537,326

(22) Filed: Aug. 7, 2009

(65) Prior Publication Data

US 2010/0032756 A1 Feb. 11, 2010

Related U.S. Application Data (60) Provisional application No. 61/086,951, filed on Aug. 7, 2008.

(51) Int. Cl.
*H01L 29/06* (2006.01)
*H01L 29/78* (2006.01)
*H01L 29/73* (2006.01)
*H01L 27/092* (2006.01)
*H01L 21/761* (2006.01)

(52) U.S. Cl. ......... 257/337; 257/E29.019; 257/E29.256; 257/E29.174; 257/E27.062; 257/E21.544; 257/495; 257/504; 257/557; 257/351; 438/416; 438/195; 438/270

(58) Field of Classification Search .................. 257/337, 257/504, 557, 351, E29.019, E29.256, E29.174, 257/E27.062, E21.544, 495; 438/416, 195, 438/270

See application file for complete search history.

(56) References Cited

U.S. PATENT DOCUMENTS

| | | | | |
|---|---|---|---|---|
| 5,347,155 | A | * | 9/1994 | Ludikhuize .................. 257/492 |
| 5,642,295 | A | * | 6/1997 | Smayling ...................... 702/182 |
| 5,917,222 | A | * | 6/1999 | Smayling et al. ............. 257/370 |
| 7,187,033 | B2 | * | 3/2007 | Pendharkar .................. 257/339 |
| 7,468,537 | B2 | * | 12/2008 | Pendharkar .................. 257/335 |
| 2006/0011974 | A1 | * | 1/2006 | Pendharkar .................. 257/334 |
| 2006/0124999 | A1 | * | 6/2006 | Pendharkar .................. 257/335 |

* cited by examiner

*Primary Examiner* — A O Williams
(74) *Attorney, Agent, or Firm* — Jacqueline J. Garner; Wade J. Brady, III; Frederick J. Telecky, Jr.

(57) ABSTRACT

A buried layer architecture which includes a floating buried layer structure adjacent to a high voltage buried layer connected to a deep well of the same conductivity type for components in an IC is disclosed. The floating buried layer structure surrounds the high voltage buried layer and extends a depletion region of the buried layer to reduce a peak electric field at lateral edges of the buried layer. When the size and spacing of the floating buried layer structure are optimized, the well connected to the buried layer may be biased to 100 volts without breakdown. Adding a second floating buried layer structure surrounding the first floating buried layer structure allows operation of the buried layer up to 140 volts. The buried layer architecture with the floating buried layer structure may be incorporated into a DEPMOS transistor, an LDMOS transistor, a buried collector npn bipolar transistor and an isolated CMOS circuit.

23 Claims, 10 Drawing Sheets

BURIED FLOATING LAYER STRUCTURE FOR IMPROVED BREAKDOWN

FIELD OF THE INVENTION

This invention relates to the field of integrated circuits. More particularly, this invention relates to high voltage components in integrated circuits with improved breakdown.

BACKGROUND OF THE INVENTION

Analog circuits frequently include high voltage components such as drain extended metal oxide semiconductor (DEMOS) transistors and buried collector bipolar transistors which operate above 100 volts and integrated circuits (ICs) with advanced complementary metal oxide semiconductor (CMOS) digital circuits, for example 180 nm and 65 nm CMOS logic and static random access memory (SRAM). It is desirable to integrate the high voltage components into the ICs to reduce analog circuit cost and complexity. High voltage components require junctions with wide depletion regions and shallow doping gradients to avoid premature breakdown and/or shortened operating lifetime, which are typically achieved using long anneals of ion implanted regions at high temperatures. However, fabrication of advanced CMOS circuits requires dimensional stability to within a few nanometers, which precludes long anneals at high temperatures. Furthermore, ICs containing advanced CMOS circuits typically have relatively thin buried layers under relatively thin epitaxial layers, compared to analog high voltage ICs. Components including buried layers with high doping densities for low electrical resistances are prone to low breakdown potentials when built with typical advanced CMOS fabrication process sequences. Adding deep well regions around buried layers to increase breakdown potentials undesirably adds considerable area to an integrated high voltage component.

Accordingly, an architecture for devices with buried layers that can operate above 100 volts in ICs built with typical advanced CMOS fabrication process sequences is desired.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a buried layer architecture for high voltage components in integrated circuits which includes a floating buried layer structure adjacent to the buried layer contacted through a well region of the same conductivity type. The buried layer architecture with the floating buried layer structure may be incorporated into a drain extended p-channel metal oxide semiconductor (DEPMOS) transistor, a laterally diffused n-channel metal oxide semiconductor (LDMOS) transistor, a buried collector npn bipolar transistor and an isolated complementary metal oxide semiconductor (CMOS) circuit. Potentials up to 140 volts on the well contacting the buried layer without breakdown may be attained by adding a second floating buried layer structure adjacent to the first floating buried layer structure.

An advantage of the instant invention is that a lateral area required to attain a given potential on the n-type buried layer without breaking down is less than lateral areas required by other buried layer configurations.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
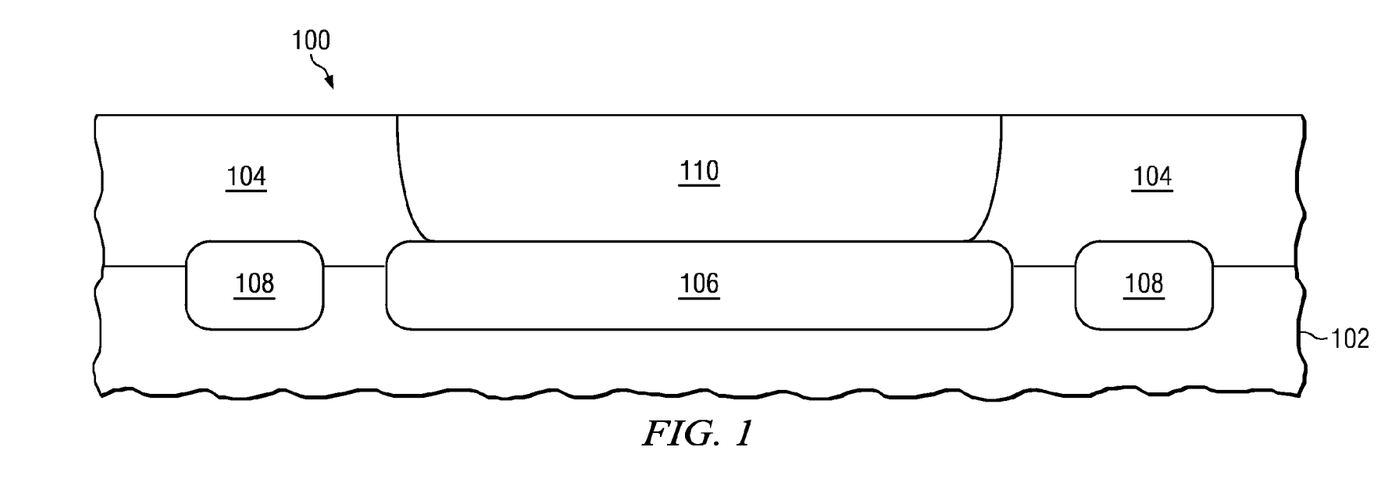
FIG. 1 is a cross-section of an IC containing a buried layer element with floating buried layer structures formed in accordance with an embodiment of the instant invention.

The need for an architecture for devices with buried layers that can operate above 100 volts in integrated circuit (ICs) built with minimized thermal budget processes is addressed by the instant invention, which provides one or more floating buried layer structures adjacent to a buried layer element in a high voltage device. FIG. 1 is a cross-section of an IC 100 containing a buried layer element with floating buried layer structures formed in accordance with an embodiment of the instant invention. The IC 100 is formed on a p-type semiconductor substrate 102 which has a p-type epitaxial layer 104 on a top surface of the substrate 102. An n-type buried layer 106 is formed at an interface between the epitaxial layer 104 and the substrate 102. A floating n-type buried layer structure 108 is formed so as to laterally surround the n-type buried layer 106. The floating n-type buried layer structure 108 may be laterally separated from the n-type buried layer 106 by a distance between 1 and 3 microns to attain operating voltages above 100 volts. A deep n-well 110 is formed in the type epitaxial layer 104 extending to the n-type buried layer 106.

During operation of a high voltage component containing the n-type buried layer 106, a potential exceeding 100 volts may be applied to the n-type buried layer 106 with respect to the substrate 102, causing an electric field to form between the n-type buried layer 106 and the substrate 102. The electric field is typically highest at lateral edges of the n-type buried layer 106. A depletion region forms around the n-type buried layer 106 and extends from the lateral edges of the n-type buried layer 106 to the floating n-type buried layer structure 108. The presence of the floating n-type buried layer structure 108 reduces the electric field at the lateral edges of the n-type buried layer 106, and increases a maximum potential that may be applies to the n-type buried layer 106 before breakdown occurs. The maximum potential strongly depends on doping levels of the substrate 102 and p-type epitaxial layer 104, and the spacing between the floating n-type buried layer structure 108 and the n-type buried layer 106. Values for the width of the floating n-type buried layer structure 108 and the spacing between the floating n-type buried layer structure 108 and the n-type buried layer 106 that maximize an operating potential for the n-type buried layer 106 may be determined by device simulation and/or fabrication and measurement of test structures which include n-type buried layers and the inventive floating buried layer structures.

An advantage of the instant embodiment is that a lateral area required to attain a potential greater than 80 volts on the n-type buried layer without breaking down is less than lateral areas required by other buried layer configurations.

Figure 2A:
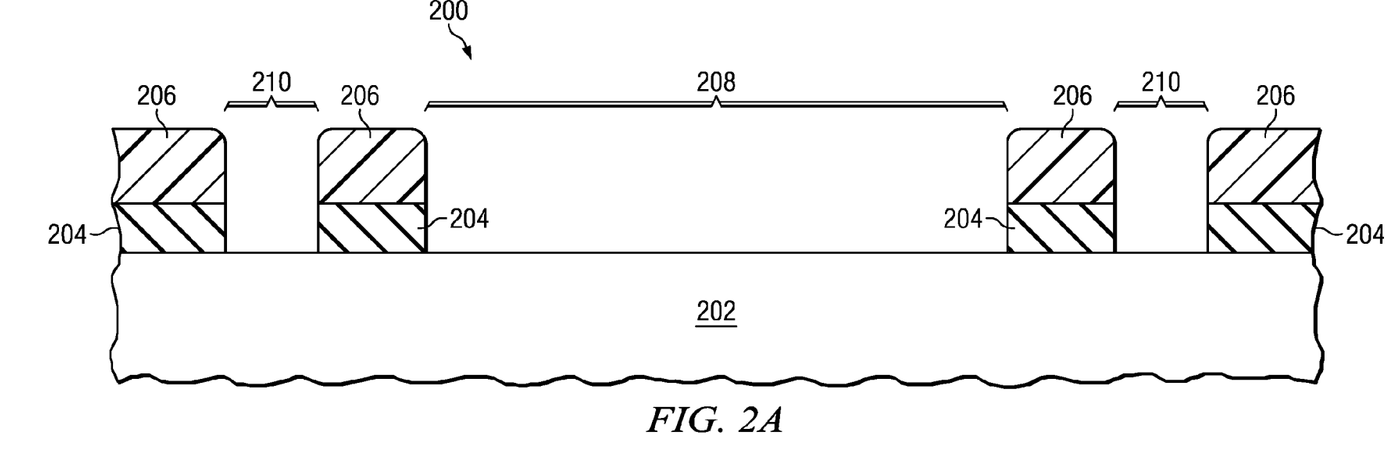
FIG. 2A through FIG. 2F are cross-sections of an IC containing a buried layer element with floating buried layer structures formed in accordance with an embodiment of the instant invention.
Figure 2B:
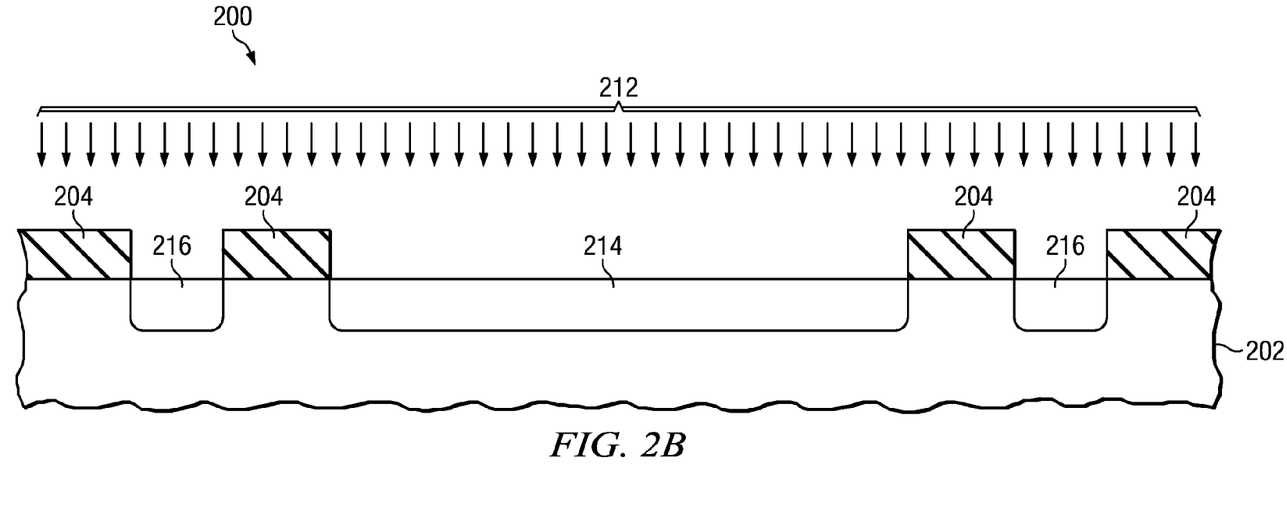

An exemplary process for forming the structure depicted in FIG. 1 is now described with reference to FIG. 2A through FIG. 2F, which are cross-sections of an IC containing a buried layer element with floating buried layer structures formed in accordance with an embodiment of the instant invention, depicted in successive stages of fabrication. FIG. 2A depicts the IC 200 which is built on a p-type semiconductor substrate 202, typically single crystal silicon with an electrical resistivity between 0.5 and 100 ohm-cm. A first oxide layer 204, typically 100 to 200 nanometers of thermally grown silicon dioxide, but possibly deposited by plasma enhanced chemical vapor deposition (PECVD), is formed on a top surface of the substrate 202. An n-type buried layer (NBL) photoresist pattern 206 is formed on a top surface of the first oxide layer 204 by known photolithographic methods to define regions for n-buried layer ion implantation, including an NBL region 208 and floating buried layer structure regions 210 on all sides of the NBL region 208, by exposing the top surface of the first oxide layer 204. The floating buried layer structure regions 210 are preferably 0.7 to 2 microns FIG. 2B depicts the IC 200 during a NBL ion implantation operation. A first set of n-type dopants 212, preferably antimony, but possibly including arsenic and/or phosphorus, is ion implanted into the regions defined for NBL ion implantation in a total dose of $3 \cdot 10^{14}$ to $1 \cdot 10^{16}$ atoms/cm$^2$, at one or more energies of 10 to 100 keV, to form an NBL implanted region 214 and floating buried layer implanted regions 216, both extending from the top surface of the substrate 202 to a depth of 20 to 100 nanometers. The NBL photoresist pattern 206 may be removed after ion implanting the first set of n-type dopants 212, commonly by exposing the IC 200 to an oxygen containing plasma, followed by a wet cleanup to remove any organic residue from the top surface of the first oxide layer 204. In an alternate embodiment, the NBL photoresist pattern 206 may be removed prior to ion implanting the first set of n-type dopants 212, and the first oxide layer 204 blocks the implanted n-type dopants from regions outside those defined for NBL ion implantation.

Figure 2C:
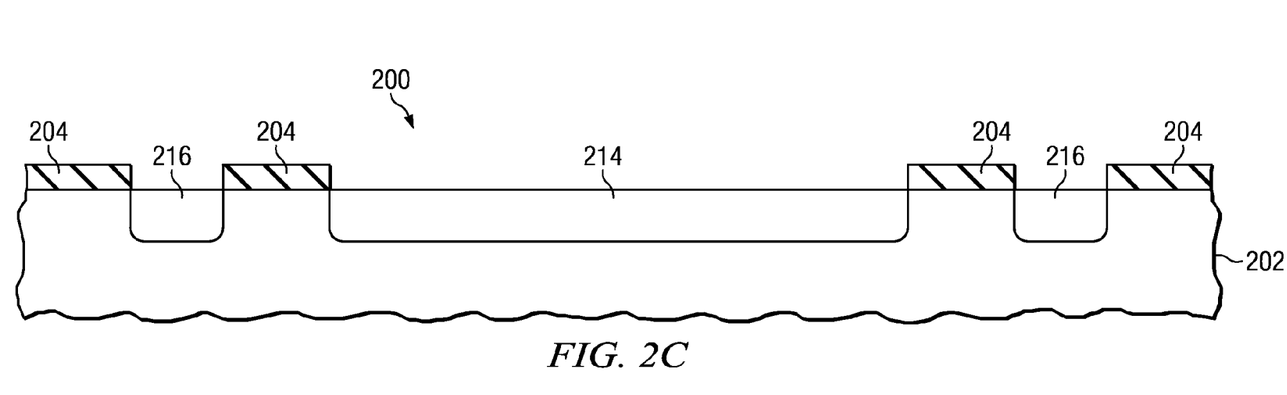

FIG. 2C depicts the IC 200 after an oxide strip process in which a thickness of the first oxide layer 204 is reduced by 25 to 75 percent. The oxide strip process is typically performed by immersing the IC 200 in an aqueous solution of dilute hydrofluoric acid, which is commonly buffered to maintain etch uniformity.

Figure 2D:
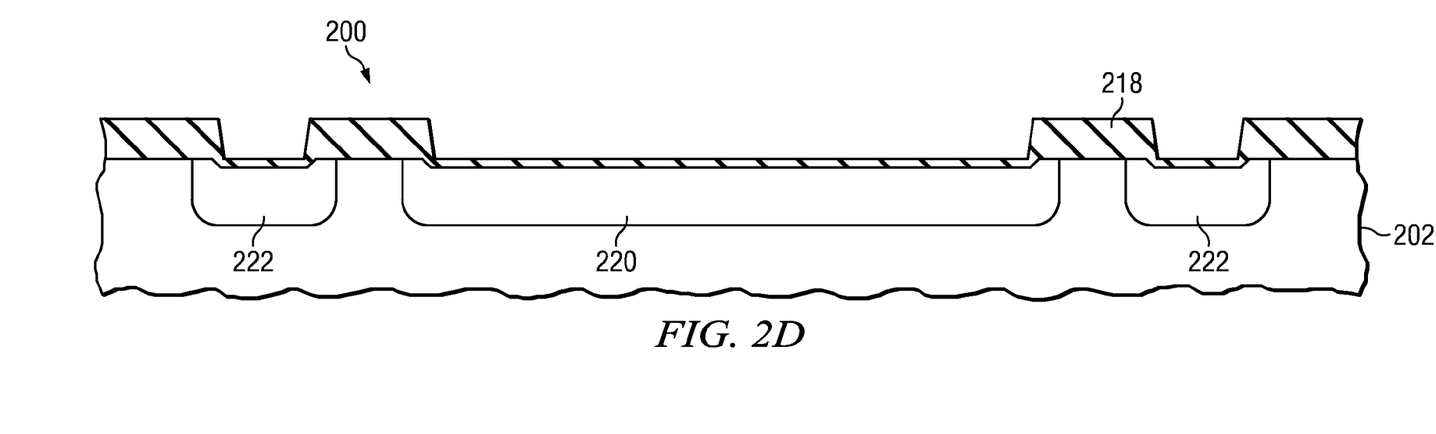

FIG. 2D depicts the IC 200 after an oxidizing anneal operation in which preferably 1 to 20 nanometers of silicon dioxide are grown on the top surface of the substrate 202 in the regions defined for the NBL ion implants, and preferably no more than 5 nanometers of silicon dioxide are grown in the existing first oxide layer regions, to form an NBL anneal oxide layer 218 of varying thickness. Oxide growth in the regions defined for the NBL ion implants may consume some silicon from the substrate 202 to form an indented region on the top surface of the substrate 202. N-type dopants in the NBL implanted region and floating buried layer implanted regions diffuse outward and become activated during the oxidizing anneal operation, to form an NBL diffused region 220 and floating buried layer diffused regions 222.

Figure 2E:
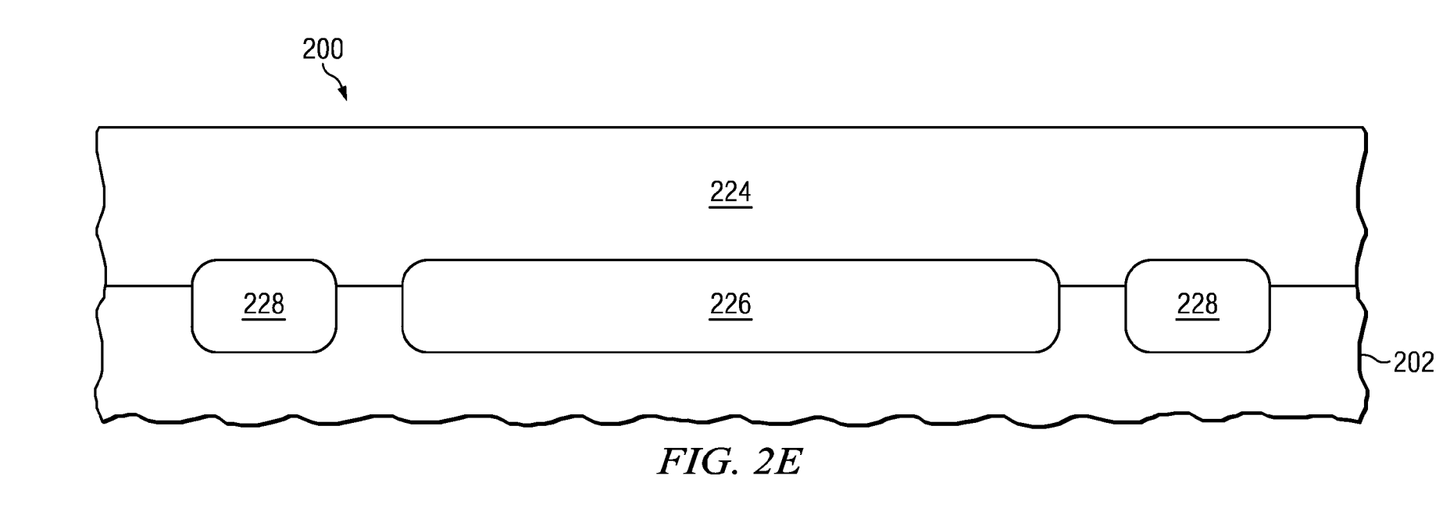

FIG. 2E depicts the IC 200 after formation of a p-type epitaxial layer 224 on a top surface of the substrate 202, typically by known vapor phase epitaxial growth methods. During growth of the p-type epitaxial layer 224, n-type dopants in the an NBL diffused region and floating buried layer diffused regions diffuse further outward into the substrate 202 and upward into the p-type epitaxial layer 224 to form an n-type buried layer 226 and floating NBL structures 228.

Figure 2F:
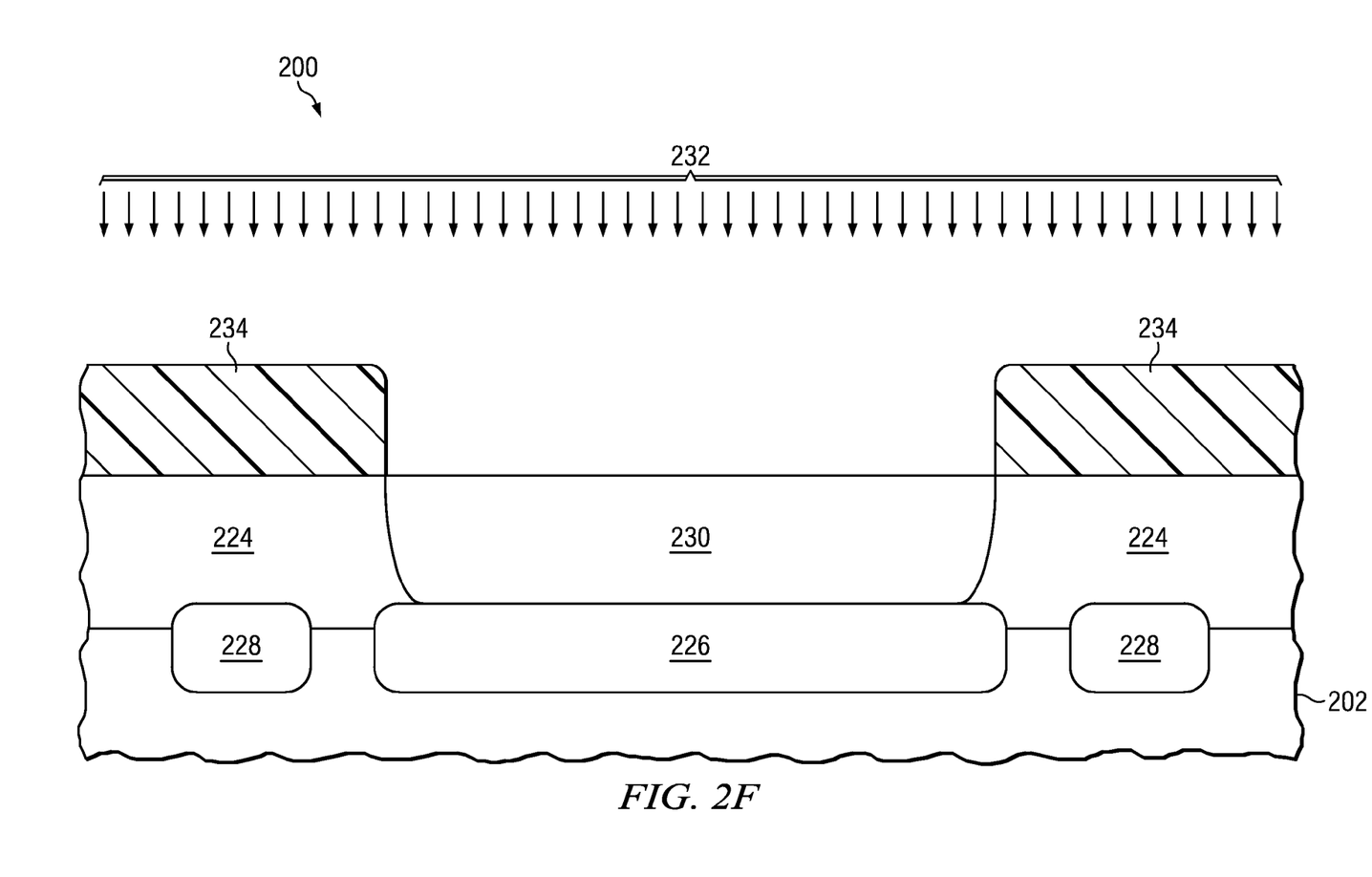

FIG. 2F depicts the IC 200 after formation of a deep n-well 230, in the p-type epitaxial layer 224, extending from a top surface of the p-type epitaxial layer 224 to the n-type buried layer 226, and substantially extending laterally to the lateral boundary of the n-type buried layer 226. The deep n-well 230 is typically formed by ion implantation of a second set of n-type dopants 232, typically phosphorus and arsenic, and possibly antimony, commonly at a total dose of $1 \cdot 10^{12}$ to $5 \cdot 10^{13}$ atoms/cm$^2$, and commonly at one or more energies between 50 keV and 3.5 MeV. A deep n-well photoresist pattern 234 blocks n-type dopants from regions outside the deep n-well 230. After implantation of the second set of n-type dopants 232, the deep n-well photoresist pattern 234 is removed, commonly by exposing the IC 200 to an oxygen containing plasma, followed by a wet cleanup to remove any organic residue from the top surface of the p-type epitaxial layer 224. Removal of the deep n-well photoresist pattern 234 is followed by an anneal operation which activates a portion of the second set of n-type dopants 232.

Figure 3A:
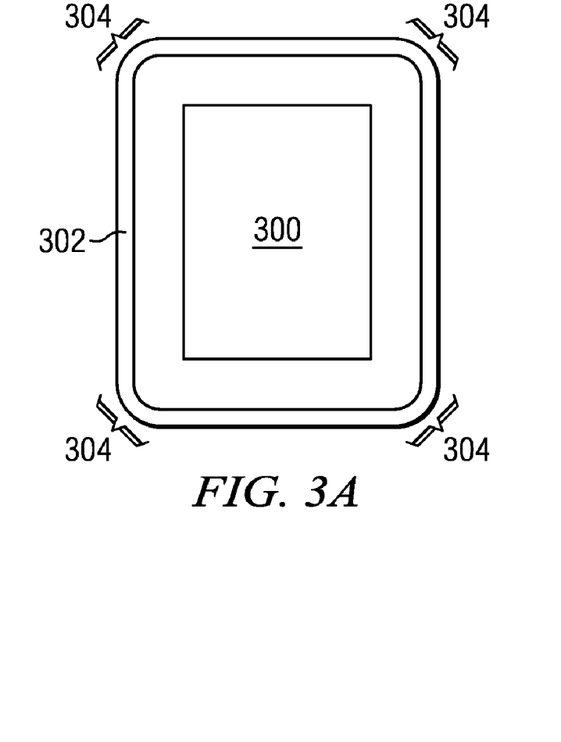
FIG. 3A and FIG. 3B depict top views of n-type buried layers and floating buried layer structures according to two embodiments of the instant invention.
Figure 3B:
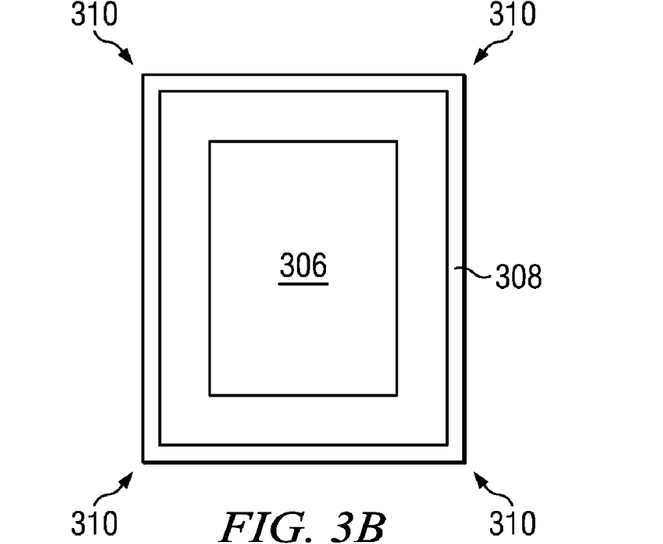

FIG. 3A and FIG. 3B depict top views of n-type buried layers and floating buried layer structures according to two embodiments of the instant invention. Referring to FIG. 3A, an n-type buried layer 300 is surrounded by a floating buried layer structure 302. In a preferred embodiment, corner regions 304 of the floating buried layer structure 302 are rounded with a radius greater than 1 micron to reduce a tendency to breakdown at the corner regions when a potential above 100 volts is applied to the n-type buried layer 300. This is advantageous because a maximum operating potential of the n-type buried layer 300 is not limited by a corner geometry of the floating buried layer structure 302.

FIG. 3B depicts an alternate embodiment of the instant invention, in which an n-type buried layer 306 is surrounded by a floating buried layer structure 308 with square corner regions 310. This configuration is advantageous because IC layout time, cost and complexity are reduced, and costs of photomasks for forming buried layer patterns are reduced.

Figure 4A:
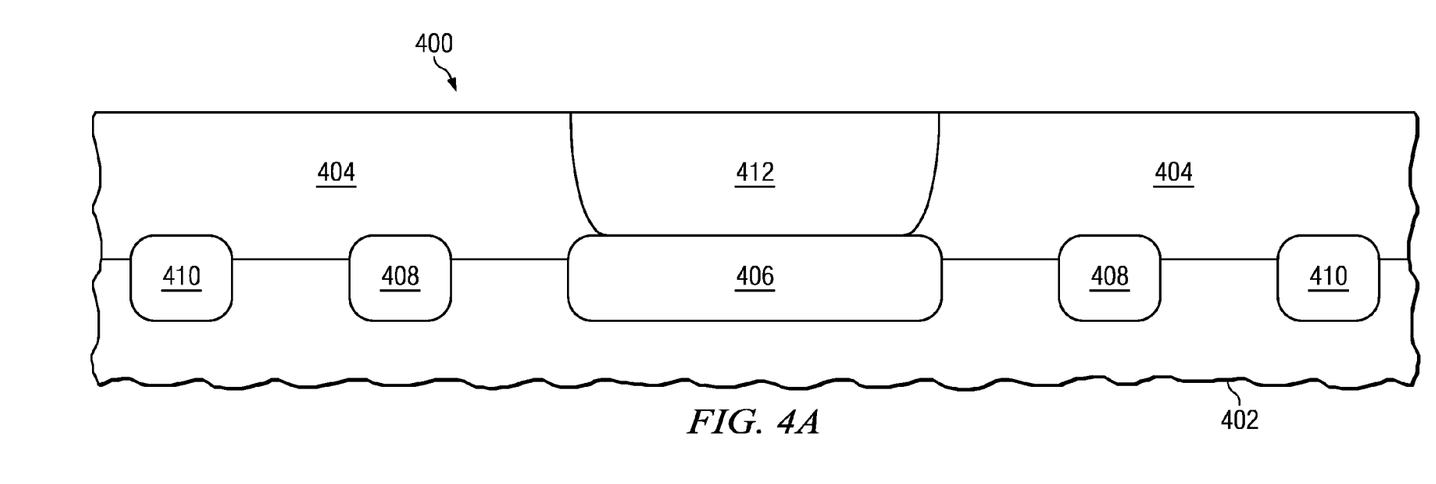
FIG. 4A and FIG. 4B depict an embodiment of the instant invention which includes two concentric floating buried layer structures.
Figure 4B:
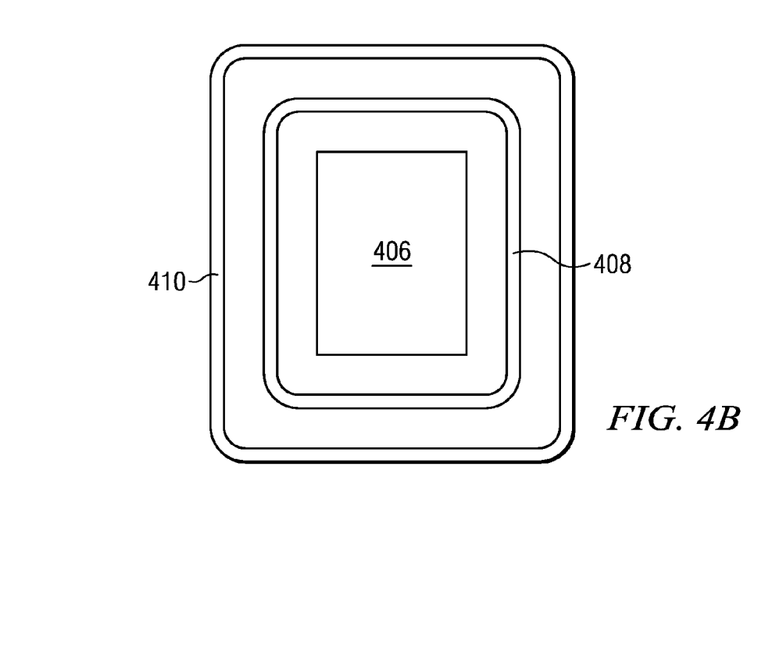

FIG. 4A and FIG. 4B depict an embodiment of the instant invention which includes two concentric floating buried layer structures to further increase a maximum potential that may be applied to an n-type buried layer. Referring to FIG. 4A, an IC 400 includes a p-type semiconductor substrate 402 having the properties discussed above in reference to FIG. 2A. A p-type epitaxial layer 404 having the properties discussed above in reference to FIG. 2E is formed on a top surface of the substrate 402. An n-type buried layer 406 is formed at an interface between the substrate 402 and the p-type epitaxial layer 404 by the processes described above in reference to FIG. 2A through FIG. 2E. Similarly, a first concentric floating buried layer structure 408, with the properties described above in reference to FIG. 2A through FIG. 2E, and surrounding lateral edges of the n-type buried layer 406, is formed during the process steps which formed the n-type buried layer 406. A second concentric floating buried layer structure 410 is formed during the process steps which formed the n-type buried layer 406 and first concentric floating buried layer structure 408. A diffused region of the second concentric floating buried layer structure 410 preferably has a width of 0.7 to 2 microns, and is preferably spaced 3 to 5 microns from the first concentric floating buried layer structure 408. A deep n-well 412 is formed in the p-type epitaxial layer 404, by processes described above in reference to FIG. 2F, extending from a top surface of the p-type epitaxial layer 404 to the n-type buried layer 406. A lateral boundary of the deep n-well 412 is substantially aligned with a lateral boundary of the n-type buried layer 406.

FIG. 4B is a top view of the n-type buried layer 406, the first concentric floating buried layer structure 408 and the second concentric floating buried layer structure 410, showing the concentric configuration of the floating buried layer structures.

During operation of a high voltage component containing the n-type buried layer 406, a potential exceeding 140 volts may be applied to the n-type buried layer 406 with respect to the substrate 402, causing an electric field to form between the n-type buried layer 406 and the substrate 402. The electric field is typically highest at lateral edges of the n-type buried layer 406. A depletion region forms around the n-type buried layer 406 and extends from the lateral edges of the n-type buried layer 406 to and around the first concentric floating buried layer structure 408 and to the second concentric floating buried layer structure 410. The presence of the first concentric floating buried layer structure 408 and second concentric floating buried layer structure 410 reduces the electric field at the lateral edges of the n-type buried layer 406, and increases a maximum potential that may be applies to the n-type buried layer 406 before breakdown occurs. The maximum potential strongly depends on doping levels of the substrate 402 and p-type epitaxial layer 404, the spacing between the first concentric floating buried layer structure 408 and the n-type buried layer 406 and the spacing between the first concentric floating buried layer structure 408 and second concentric floating buried layer structure 410. Values for widths of the diffused regions of the first concentric floating buried layer structure 408 and second concentric floating buried layer structure 410, the spacing between the first concentric floating buried layer structure 408 and the n-type buried layer 406 and the spacing between the first concentric floating buried layer structure 408 and second concentric floating buried layer structure 410 that maximize an operating potential for the n-type buried layer 406 may be determined by device simulation and/or fabrication and measurement of test structures which include n-type buried layers and the inventive floating buried layer structures.

The advantages recited above for an n-type buried layer in a p-type substrate with n-type floating buried layer structures may be realized for a p-type buried layer in an n-type substrate with p-type floating buried layer structures, with an appropriate change of dopant types and appropriate modifications of fabrication processes.

Figure 5:
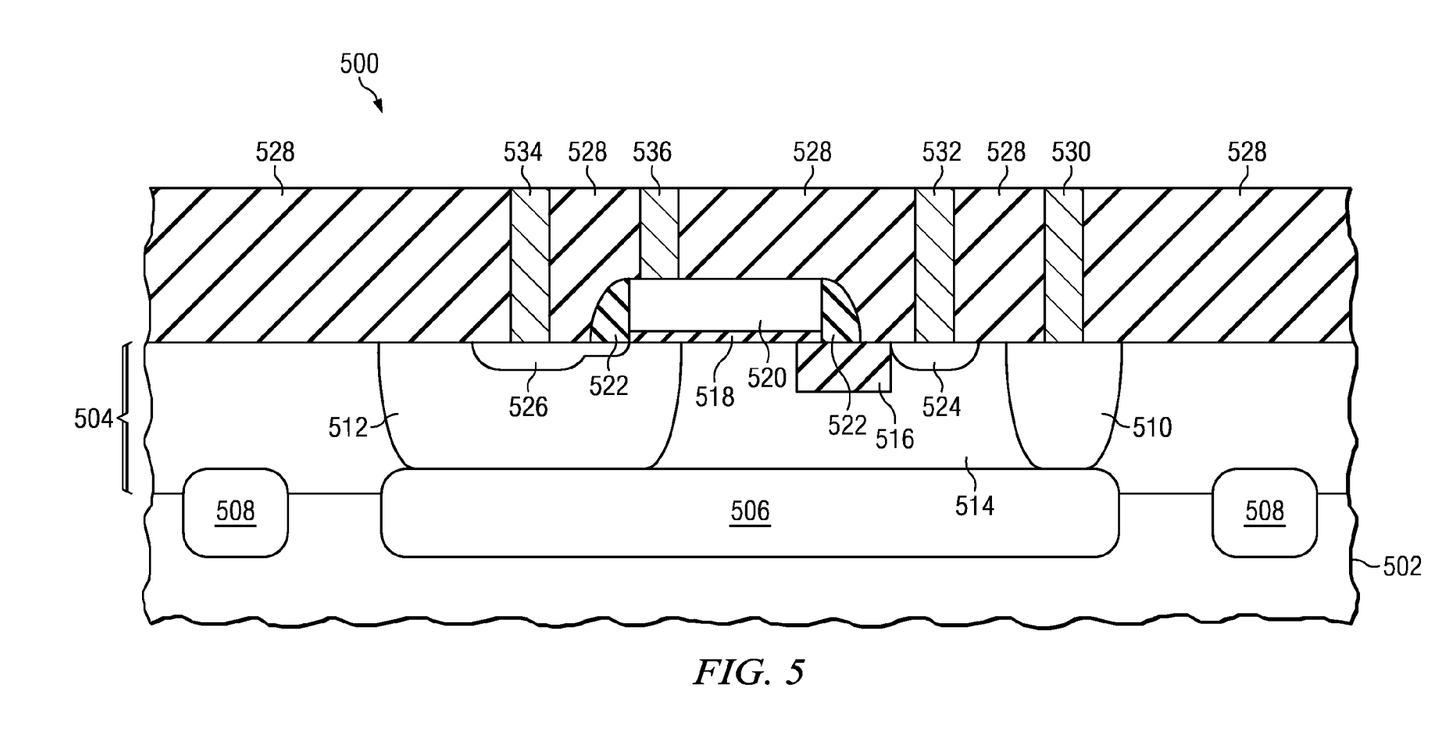
FIG. 5 is a cross-section of an IC containing a drain extended p-channel metal oxide semiconductor (DEPMOS) transistor including an n-type buried layer and floating buried layer structures formed according to the instant invention.

FIG. 5 is a cross-section of an IC containing a drain extended p-channel metal oxide semiconductor (DEPMOS) transistor including an n-type buried layer and floating buried layer structures formed according to the instant invention. The IC 500 includes a p-type semiconductor substrate 502 with properties as described above in reference to FIG. 2A. A p-type epitaxial layer 504, with properties as described above in reference to FIG. 2E, is formed on a top surface of the substrate 502. An n-type buried layer 506 is formed at an interface between the substrate 502 and the p-type epitaxial layer 504 by the processes described above in reference to FIG. 2A through FIG. 2E. Similarly, a floating buried layer structure 508, with the properties described above in reference to FIG. 2A through FIG. 2E, and surrounding lateral edges of the n-type buried layer 506, is formed during the process steps which formed the n-type buried layer 506. A first deep n-well 510 is formed in the p-type epitaxial layer 504, by processes described above in reference to FIG. 2F, extending from a top surface of the p-type epitaxial layer 504 to the n-type buried layer 506. The first deep n-well 510 is outside a drain region of the DEPMOS transistor. A second deep n-well 512 is formed during the same process sequence as the first deep n-well 510, and extends from the top surface of the p-type epitaxial layer 504 in a source region of the DEPMOS transistor to the n-type buried layer 506. The first and second deep n-wells 410, 412 are joined in regions out of the plane of FIG. 5, such that a p-type isolated drain region 514 is electrically isolated from the p-type epitaxial layer 504 outside the DEPMOS transistor. An optional element of field oxide 516 is formed at a top surface of the p-type isolated drain region 514 to divide a drain contact region from a channel region. A gate dielectric layer 518 is formed on a top surface of the p-type isolated drain region 514, typically 1 to 50 nanometers of silicon dioxide, nitrogen doped silicon dioxide, silicon oxy-nitride, hafnium oxide, layers of silicon dioxide and silicon nitride, or other insulating material. A DEPMOS gate 520, typically polycrystalline silicon, commonly known as polysilicon, between 50 and 500 nanometers thick, is formed on a top surface of the gate dielectric layer 518. Gate sidewall spacers 522, typically layers of silicon dioxide and silicon nitride between 20 and 150 nanometers thick, are formed on lateral surfaces of the DEPMOS gate 520. A p-type drain contact diffused region 524 with a dopant concentration between $10^{19}$ and $10^{22}$ cm$^{-3}$ is formed at a top surface of the drain contact region. A p-type source diffused region 526, also with a dopant concentration between $10^{19}$ and $10^{22}$ cm$^{-3}$, is formed at a top surface of the source region adjacent to the DEPMOS gate 520. It is common to form the p-type drain contact diffused region 524 and the p-type source diffused region 526 during the same process steps. A pre-metal dielectric (PMD) layer 528, typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 150 nanometers of a hard material such as silicon nitride, silicon carbide nitride or silicon carbide, is formed on top surfaces of the source region, DEPMOS gate 520, drain region and first deep n-well 510. A buried layer contact 530, a drain contact 532, a source contact 534 and a gate contact 536 are formed in the PMD by known methods to make electrical connections to the first deep n-well 510, the p-type drain contact diffused region 524, the p-type source diffused region 526, and the DEPMOS gate 520, respectively.

During operation of the DEPMOS transistor depicted in FIG. 5, a potential up to 100 volts may be applied to the buried layer contact 530 with respect to the substrate 502, which is typically grounded. The DEPMOS transistor is isolated from the substrate 502 and so the DEPMOS transistor may be operated at up to 100 volts above the substrate potential. This is advantageous because it provides capability to interface with a wider range of inputs and outputs than a DEPMOS transistor with a more limited operation voltage range.

The operating voltage range of the DEPMOS transistor described above may be increase to 140 volts by adding a second floating buried layer structure, as described above in reference to FIG. 4A and FIG. 4B.

Figure 6:
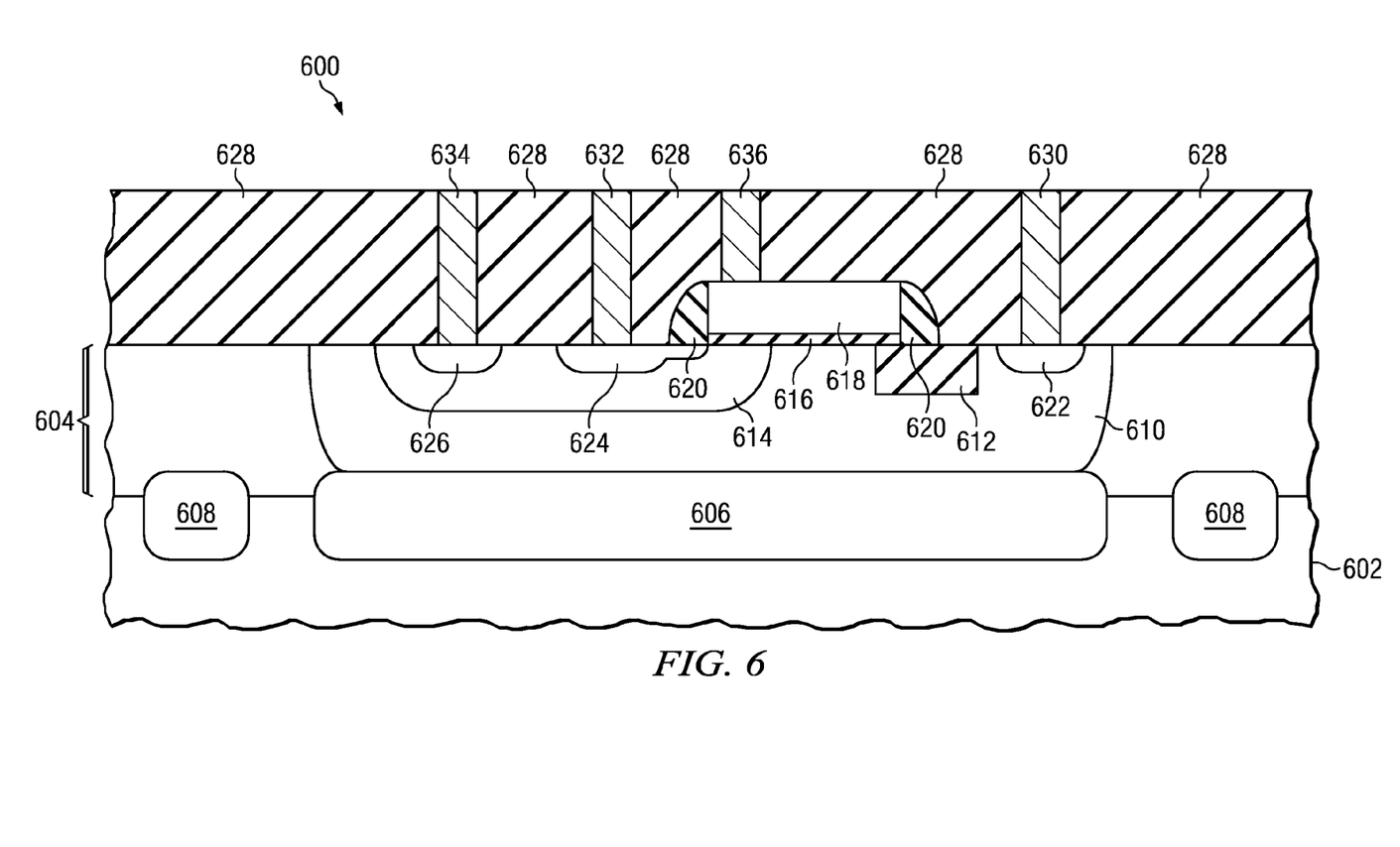
FIG. 6 is a cross-section of an IC containing an n-channel laterally diffused metal oxide semiconductor (LDMOS) transistor including an n-type buried layer and floating buried layer structures formed according to the instant invention.

FIG. 6 is a cross-section of an IC containing an n-channel laterally diffused metal oxide semiconductor (LDMOS) transistor including an n-type buried layer and floating buried layer structures formed according to the instant invention. The IC 600 includes a p-type semiconductor substrate 602 with properties as described above in reference to FIG. 2A. A p-type epitaxial layer 604, with properties as described above in reference to FIG. 2E, is formed on a top surface of the substrate 602. An n-type buried layer 606 is formed at an interface between the substrate 602 and the p-type epitaxial layer 604 by the processes described above in reference to FIG. 2A through FIG. 2E. Similarly, a floating buried layer structure 608, with the properties described above in reference to FIG. 2A through FIG. 2E, and surrounding lateral edges of the n-type buried layer 606, is formed during the process steps which formed the n-type buried layer 606. A deep n-well 610 is formed in the p-type epitaxial layer 604, by processes described above in reference to FIG. 2F, extending from a top surface of the p-type epitaxial layer 604 to the n-type buried layer 606. A lateral boundary of the deep n-well 610 is substantially aligned with a lateral boundary of the n-type buried layer 606. An optional element of field oxide 612 is formed at a top surface of the deep n-well 610 to divide a drain contact region from a channel region. A p-type well 614, commonly known as a p-well 614, with a dopant concentration between $10^{17}$ and $10^{19}$ cm$^{-3}$ is formed in the deep n-well 610 in a source and channel region of the LDMOS transistor. A gate dielectric layer 616 is formed on a top surface of the deep n-well 610 adjacent to the field oxide element 612, typically 1 to 50 nanometers of silicon dioxide, nitrogen doped silicon dioxide, silicon oxy-nitride, hafnium oxide, layers of silicon dioxide and silicon nitride, or other insulating material. An LDMOS gate 618, typically polysilicon, between 50 and 500 nanometers thick, is formed on a top surface of the gate dielectric layer 616. Gate sidewall spacers 620, typically layers of silicon dioxide and silicon nitride between 20 and 150 nanometers thick, are formed on lateral surfaces of the LDMOS gate 618. An n-type drain contact diffused region 622 with a dopant concentration between $10^{19}$ and $10^{22}$ cm$^{-3}$ is formed at a top surface of a drain contact region adjacent to the field oxide element 612. An n-type source diffused region 624, also with a dopant concentration between $10^{19}$ and $10^{22}$ cm$^{-3}$, is formed at a top surface of the source region adjacent to the LDMOS gate 618. It is common to form the n-type drain contact diffused region 622 and the n-type source diffused region 624 during the same process steps. A p-type substrate diffused contact region 626, with a dopant concentration between $10^{19}$ and $10^{22}$ cm$^{-3}$, is formed at a top surface of the p-well 614 adjacent to the n-type source diffused region 624. A PMD layer 628, as described above in reference to FIG. 5, is formed on top surfaces of the LDMOS gate 618, the n-type drain contact diffused region 622, n-type source diffused region 624 and the p-type substrate diffused contact region 626. A drain contact 630, a source contact 632, a substrate contact 634 and a gate contact 636 are formed in the PMD by known methods to make electrical connections to the deep n-well 610 and n-type buried layer 606 through the n-type drain contact diffused region 622, the n-type source diffused region 624, the p-type channel region through the p-type substrate diffused contact region 626 and the LDMOS gate 618, respectively.

During operation of the LDMOS transistor depicted in FIG. 6, a potential up to 100 volts may be applied to the drain contact 630 with respect to the substrate 602, which is typically grounded. The LDMOS transistor may thusly be operated at up to 100 volts above the substrate potential. This is advantageous because it provides capability to interface with a wider range of inputs and outputs than an LDMOS transistor with a more limited operation voltage range.

The operating voltage range of the LDMOS transistor described above may be increase to 140 volts by adding a second floating buried layer structure, as described above in reference to FIG. 4A and FIG. 4B.

Figure 7:
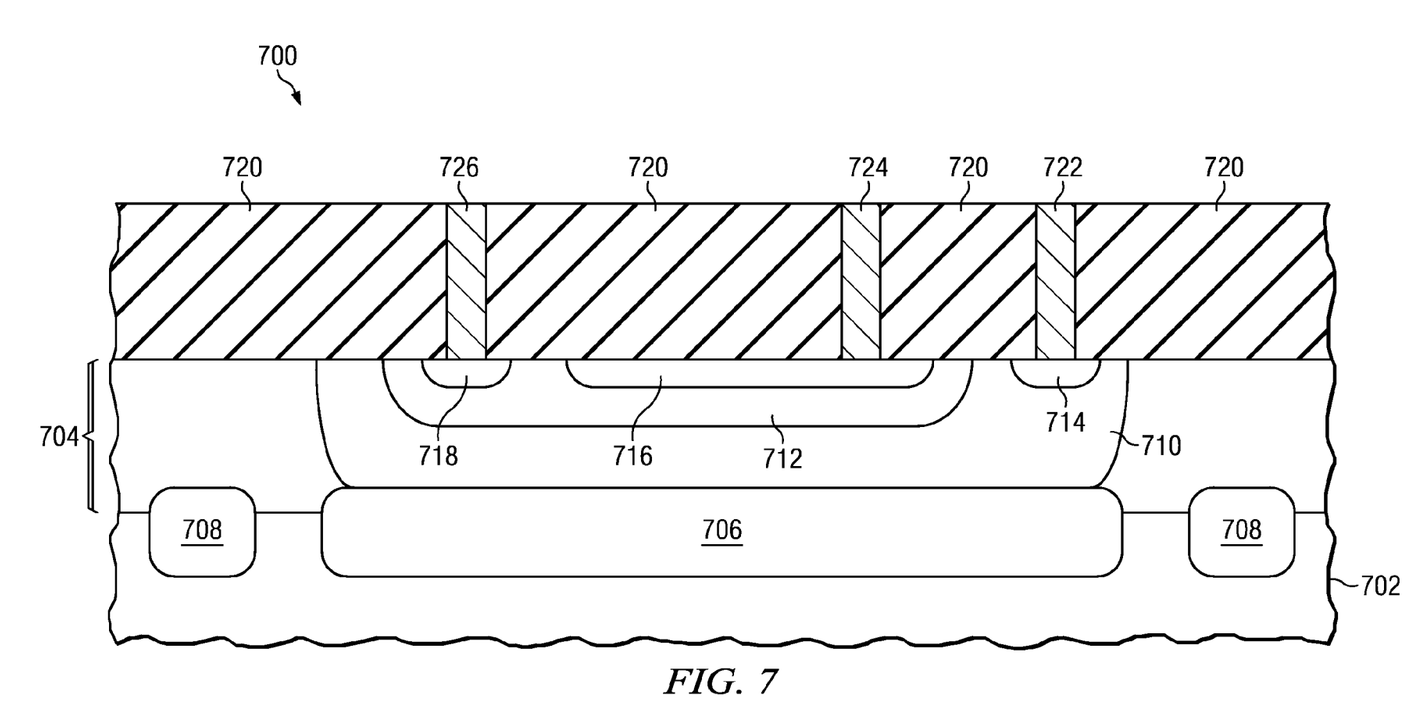
FIG. 7 is a cross-section of an IC containing an npn bipolar transistor including an n-type buried layer and floating buried layer structures formed according to the instant invention.

FIG. 7 is a cross-section of an IC containing an npn bipolar transistor including an n-type buried layer and floating buried layer structures formed according to the instant invention. The IC 700 includes a p-type semiconductor substrate 702 with properties as described above in reference to FIG. 2A. A p-type epitaxial layer 704, with properties as described above in reference to FIG. 2E, is formed on a top surface of the substrate 702. An n-type buried layer 706 is formed at an interface between the substrate 702 and the p-type epitaxial layer 704 by the processes described above in reference to FIG. 2A through FIG. 2E. Similarly, a floating buried layer structure 708, with the properties described above in reference to FIG. 2A through FIG. 2E, and surrounding lateral edges of the n-type buried layer 706, is formed during the process steps which formed the n-type buried layer 706. A deep n-well 710 is formed in the p-type epitaxial layer 704, by processes described above in reference to FIG. 2F, extending from a top surface of the p-type epitaxial layer 704 to the n-type buried layer 706. A lateral boundary of the deep n-well 710 is substantially aligned with a lateral boundary of the n-type buried layer 706. A p-well 712, with a dopant concentration between $10^{17}$ and $10^{19}$ cm$^{-3}$ is formed in the deep n-well 710 in a base region of the bipolar transistor. An n-type collector contact diffused region 714 with a dopant concentration between $10^{19}$ and $10^{22}$ cm$^{-3}$ is formed at a top surface of a collector contact region in the deep n-well 710 adjacent to the p-well 712. An n-type emitter diffused region 716, also with a dopant concentration between $10^{19}$ and $10^{22}$ cm$^{-3}$, is formed at a top surface of the p-well 712 above the base region. It is common to form the n-type collector contact diffused region 714 and the n-type emitter diffused region 716 during the same process steps. A p-type base diffused contact region 718, with a dopant concentration between $10^{19}$ and $10^{22}$ cm$^{-3}$, is formed at a top surface of the p-well 712 adjacent to the n-type emitter diffused region 716. A PMD layer 720, as described above in reference to FIG. 5, is formed on top surfaces of the n-type collector contact diffused region 714, the n-type emitter diffused region 716, and the p-type base diffused contact region 718. A collector contact 722, an emitter contact 724, and a base contact 726 are formed in the PMD by known methods to make electrical connections to the deep n-well 710 and n-type buried layer 706 through the n-type collector contact diffused region 714, the n-type emitter diffused region 716, and the p-type base region through the p-type base diffused contact region 718, respectively.

During operation of the bipolar transistor depicted in FIG. 7, a potential up to 100 volts may be applied to the collector contact 722 with respect to the substrate 702, which is typically grounded. The bipolar transistor may thusly be operated at up to 100 volts above the substrate potential. This is advantageous because it provides capability to interface with a wider range of inputs and outputs than a bipolar transistor with a more limited operation voltage range.

The operating voltage range of the bipolar transistor described above may be increase to 140 volts by adding a second floating buried layer structure, as described above in reference to FIG. 4A and FIG. 4B.

Figure 8:
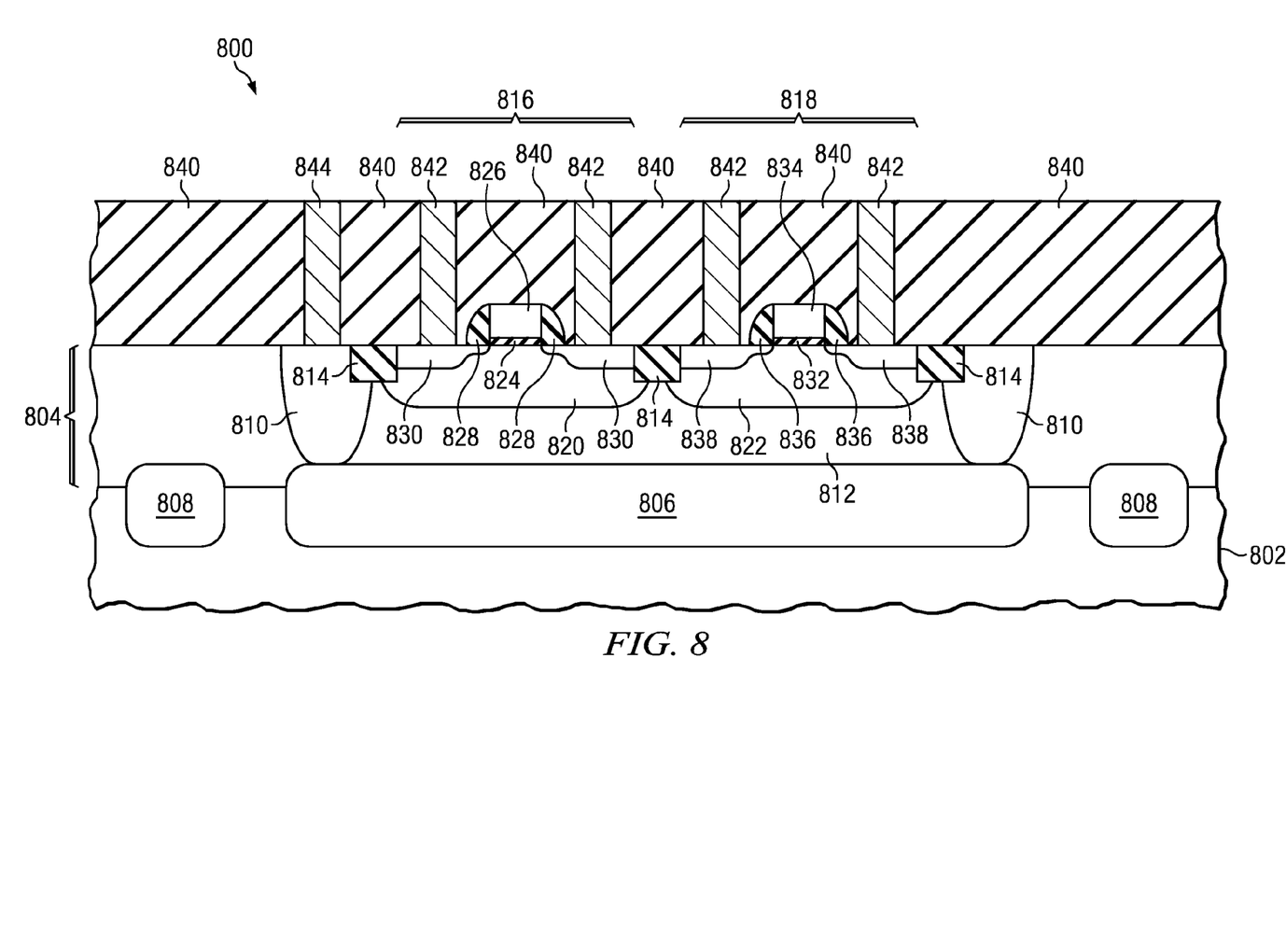
FIG. 8 is a cross-section of an IC containing an isolated complementary metal oxide semiconductor (CMOS) circuit including an n-type buried layer and floating buried layer structures formed according to the instant invention.

FIG. 8 is a cross-section of an IC containing an isolated complementary metal oxide semiconductor (CMOS) circuit including an n-type buried layer and floating buried layer structures formed according to the instant invention. The IC 800 includes a p-type semiconductor substrate 802 with properties as described above in reference to FIG. 2A. A p-type epitaxial layer 804, with properties as described above in reference to FIG. 2E, is formed on a top surface of the substrate 802. An n-type buried layer 806 is formed at an interface between the substrate 802 and the p-type epitaxial layer 804 by the processes described above in reference to FIG. 2A through FIG. 2E. Similarly, a floating buried layer structure 808, with the properties described above in reference to FIG. 2A through FIG. 2E, and surrounding lateral edges of the n-type buried layer 806, is formed during the process steps which formed the n-type buried layer 806. Deep n-wells 810 are formed in the p-type epitaxial layer 804, by processes described above in reference to FIG. 2F, extending from a top surface of the p-type epitaxial layer 804 to the n-type buried layer 806. The deep n-wells 810 are joined in regions out of the plane of FIG. 8, such that a p-type isolated CMOS substrate region 812 is electrically isolated from the p-type epitaxial layer 804 outside the CMOS circuit. Optional elements of field oxide 814 are formed at a top surface of the p-type isolated CMOS region 812 to isolate the top surface of the p-type isolated CMOS region 812 from the deep n-wells 810 and to isolate a region for an n-channel metal oxide semiconductor (NMOS) transistor 816 from a region for a p-channel metal oxide semiconductor (NMOS) transistor 818. A p-well 820 is formed using known methods in the NMOS region 816 at a top surface of the p-type isolated CMOS region 812, extending to a depth of 250 to 600 nanometers. Similarly, an n-well 822 is formed using known methods in the PMOS region 818 at a top surface of the p-type isolated CMOS region 812, extending to a depth of 250 to 600 nanometers. An NMOS transistor is formed in the NMOS region 816, using known methods, which includes an NMOS gate dielectric layer 824, an NMOS gate 826, NMOS gate sidewall spacers 828, and n-type source and drain regions 830. Similarly, a PMOS transistor is formed in the PMOS region 818, using known methods, which includes a PMOS gate dielectric layer 832, a PMOS gate 834, PMOS gate sidewall spacers 836, and p-type source and drain regions 838. A PMD layer 840, as described above in reference to FIG. 5, is formed on top surfaces of the NMOS and PMOS transistors. CMOS contacts 842 and a deep n-well contact 844 are formed in the PMD by known methods to make electrical connections to the n-type source and drain regions 830 and p-type source and drain regions 838.

During operation of the CMOS circuit depicted in FIG. 8, a potential up to 100 volts may be applied to the deep n-well contact 844 with respect to the substrate 802, which is typically grounded. The CMOS circuit may thusly be operated at up to 100 volts above the substrate potential. This is advantageous because it provides capability to interface with a wider range of inputs and outputs than a CMOS with a more limited operation voltage range.

The operating voltage range of the CMOS described above may be increase to 140 volts by adding a second floating buried layer structure, as described above in reference to FIG. 4A and FIG. 4B.

What is claimed is:

1. An electronic component containing a buried layer element in an integrated circuit (IC), comprising:
   a buried layer element of a first conductivity type formed at an interface between a semiconductor substrate of a second conductivity type and an epitaxial layer of said second conductivity type formed on a top surface of said semiconductor substrate; and
   a floating buried layer structure of said first conductivity type formed at said interface between said semiconductor substrate and said epitaxial layer laterally surrounding said buried layer element.

2. The electronic component of claim 1, in which:
   said electronic component is a drain extended p-channel metal oxide semiconductor (DEPMOS) transistor;
   said first conductivity type is n-type; and
   said second conductivity type is p-type;
   and further comprising:
   deep n-wells formed in said epitaxial layer extending from a top surface of said epitaxial layer to said buried layer element, such that a p-type region of said epitaxial layer above said buried layer element is electrically isolated by said deep n-wells;
   a gate dielectric layer formed on a top surface of said epitaxial layer;
   a DEPMOS gate formed on a top surface of said gate dielectric layer overlapping a portion of said deep n-wells and a portion of said isolated p-type region; and
   a p-type source region formed in said deep n-wells adjacent to said DEPMOS gate.

3. The electronic component of claim 1, in which:
   said electronic component is a laterally diffused n-channel metal oxide semiconductor (LDMOS) transistor;
   said first conductivity type is n-type; and
   said second conductivity type is p-type;
   and further comprising:
   a deep n-well formed in said epitaxial layer extending from a top surface of said epitaxial layer to said buried layer element;
   a p-well formed in said deep n-well;
   a gate dielectric layer formed on a top surface of said epitaxial layer;
   an LDMOS gate formed on a top surface of said gate dielectric layer overlapping a portion of said deep n-well and a portion of said p-well; and
   an n-type source region formed in said p-well adjacent to said LDMOS gate.

4. The electronic component of claim 1, in which:
   said electronic component is a buried collector npn bipolar transistor;
   said first conductivity type is n-type; and
   said second conductivity type is p-type;

and further comprising:
a deep n-well formed in said epitaxial layer extending from a top surface of said epitaxial layer to said buried layer element;
a p-type base region formed in said deep n-well; and
an n-type emitter region formed in said p-type base region.

5. The electronic component of claim 1, in which:
said electronic component is an isolated complementary metal oxide semiconductor (CMOS) circuit;
said first conductivity type is n-type; and
said second conductivity type is p-type;
and further comprising:
deep n-wells formed in said epitaxial layer extending from a top surface of said epitaxial layer to said buried layer element, such that a p-type region of said epitaxial layer above said buried layer element is electrically isolated by said deep n-wells;
an n-channel metal oxide semiconductor (NMOS) transistor formed in said isolated p-type region; and
a p-channel metal oxide semiconductor (PMOS) transistor formed in said isolated p-type region.

6. The electronic component of claim 1, further comprising a second floating buried layer structure of said first conductivity type formed at said interface between said semiconductor substrate and said epitaxial layer laterally adjacent to and surrounding said first floating buried layer structure.

7. The electronic component of claim 1, in which corners of said floating buried layer structure have a radius greater than 1 micron.

8. The electronic component of claim 1, in which said floating buried layer structure is laterally separated from said buried layer element by a distance between 1 and 3 microns.

9. An IC containing an electronic component with a buried layer element, comprising:
a semiconductor substrate of a first conductive type;
an epitaxial layer of said first conductivity type formed on a top surface of said semiconductor substrate;
a buried layer element of a second conductivity type formed at an interface between said semiconductor substrate and said epitaxial layer;
a floating buried layer structure of said second conductivity type formed at said interface between said semiconductor substrate and said epitaxial layer laterally surrounding said buried layer element.

10. The IC of claim 9, in which:
said electronic component is a DEPMOS transistor;
said first conductivity type is p-type; and
said second conductivity type is n-type;
and further comprising:
deep n-wells formed in said epitaxial layer extending from a top surface of said epitaxial layer to said buried layer element, such that a p-type region of said epitaxial layer above said buried layer element is electrically isolated by said deep n-wells;
a gate dielectric layer formed on a top surface of said epitaxial layer;
a DEPMOS gate formed on a top surface of said gate dielectric layer overlapping a portion of said deep n-wells and a portion of said isolated p-type region; and
a p-type source region formed in said deep n-wells adjacent to said DEPMOS gate.

11. The IC of claim 9, in which:
said electronic component is a LDMOS transistor;
said first conductivity type is p-type; and
said second conductivity type is n-type;
and further comprising:
a deep n-well formed in said epitaxial layer extending from a top surface of said epitaxial layer to said buried layer element;
a p-well formed in said deep n-well;
a gate dielectric layer formed on a top surface of said epitaxial layer;
an LDMOS gate formed on a top surface of said gate dielectric layer overlapping a portion of said deep n-well and a portion of said p-well; and
an n-type source region formed in said p-well adjacent to said LDMOS gate.

12. The IC of claim 9, in which:
said electronic component is a buried collector npn bipolar transistor;
said first conductivity type is p-type; and
said second conductivity type is n-type;
and further comprising:
a deep n-well formed in said epitaxial layer extending from a top surface of said epitaxial layer to said buried layer element;
a p-type base region formed in said deep n-well; and
an n-type emitter region formed in said p-type base region.

13. The IC of claim 9, in which:
said electronic component is an isolated CMOS circuit;
said first conductivity type is p-type; and
said second conductivity type is n-type;
and further comprising:
deep n-wells formed in said epitaxial layer extending from a top surface of said epitaxial layer to said buried layer element, such that a p-type region of said epitaxial layer above said buried layer element is electrically isolated by said deep n-wells;
an NMOS transistor formed in said isolated p-type region; and
a PMOS transistor formed in said isolated p-type region.

14. The IC of claim 9, further comprising a second floating buried layer structure of said second conductivity type formed at said interface between said semiconductor substrate and said epitaxial layer laterally adjacent to and surrounding said first floating buried layer structure.

15. The IC of claim 9, in which corners of said floating buried layer structure have a radius greater than 1 micron.

16. The IC component of claim 9, in which said floating buried layer structure is laterally separated from said buried layer element by a distance between 1 and 3 microns.

17. A method of forming an IC containing an electronic component with a buried layer element, comprising the steps of:
providing a semiconductor substrate of a first conductive type;
forming an epitaxial layer of said first conductivity type on a top surface of said semiconductor substrate;
forming a buried layer element of a second conductivity type at an interface between said semiconductor substrate and said epitaxial layer;
forming a floating buried layer structure of said second conductivity type at said interface between said semiconductor substrate and said epitaxial layer laterally surrounding said buried layer element.

18. The method of claim 17, in which:
said electronic component is a DEPMOS transistor;
said first conductivity type is p-type; and
said second conductivity type is n-type;
and further comprising the steps of:
forming deep n-wells in said epitaxial layer which extend from a top surface of said epitaxial layer to said buried layer element, such that a p-type region of said epitaxial layer above said buried layer element is electrically isolated by said deep n-wells;

forming a gate dielectric layer on a top surface of said epitaxial layer;

forming a DEPMOS gate on a top surface of said gate dielectric layer which overlaps a portion of said deep n-wells and a portion of said isolated p-type region; and forming a p-type source region in said deep n-wells adjacent to said DEPMOS gate.

19. The method of claim 17, in which:

said electronic component is a LDMOS transistor;
said first conductivity type is p-type; and
said second conductivity type is n-type;
and further comprising the steps of:

forming a deep n-well in said epitaxial layer which extends from a top surface of said epitaxial layer to said buried layer element;

forming a p-well in said deep n-well;

forming a gate dielectric layer on a top surface of said epitaxial layer;

forming an LDMOS gate on a top surface of said gate dielectric layer which overlaps a portion of said deep n-well and a portion of said p-well; and forming an n-type source region in said p-well adjacent to said LDMOS gate.

20. The method of claim 17, in which:

said electronic component is a buried collector npn bipolar transistor;

said first conductivity type is p-type; and
said second conductivity type is n-type;
and further comprising the steps of:

forming a deep n-well in said epitaxial layer which extends from a top surface of said epitaxial layer to said buried layer element;

forming a p-type base region in said deep n-well; and
forming an n-type emitter region in said p-type base region.

21. The method of claim 17, in which:

said electronic component is an isolated CMOS circuit;
said first conductivity type is p-type; and
said second conductivity type is n-type;
and further comprising the steps of:

forming deep n-wells in said epitaxial layer which extend from a top surface of said epitaxial layer to said buried layer element, such that a p-type region of said epitaxial layer above said buried layer element is electrically isolated by said deep n-wells;

forming an NMOS transistor in said isolated p-type region; and forming a PMOS transistor in said isolated p-type region.

22. The method of claim 17, in which corners of said floating buried layer structure have a radius greater than 1 micron.

23. The method of claim 17, in which said floating buried layer structure is laterally separated from said buried layer element by a distance between 1 and 3 microns.

* * * * *